US012085985B2

(12) United States Patent
Sung et al.

(10) Patent No.: US 12,085,985 B2
(45) Date of Patent: Sep. 10, 2024

(54) MOBILE BATTERY POWERED WORKSTATION

(71) Applicant: Green Cubes Technology, LLC, Kokomo, IN (US)

(72) Inventors: Goo Sung, Everett, WA (US); Mohammed Alobaidi, Kokomo, IN (US); Calvin Ting, Kokomo, IN (US)

(73) Assignee: Green Cubes Technology, LLC, Kokomo, IN (US)

( * ) Notice: Subject to any disclaimer, the term of this patent is extended or adjusted under 35 U.S.C. 154(b) by 741 days.

(21) Appl. No.: 17/259,001

(22) PCT Filed: Jul. 9, 2019

(86) PCT No.: PCT/US2019/041082
§ 371 (c)(1),
(2) Date: Jan. 8, 2021

(87) PCT Pub. No.: WO2020/014283
PCT Pub. Date: Jan. 16, 2020

(65) Prior Publication Data
US 2021/0318724 A1 Oct. 14, 2021

Related U.S. Application Data

(60) Provisional application No. 62/695,495, filed on Jul. 9, 2018.

(51) Int. Cl.
*G06F 1/16* (2006.01)
*A47B 21/03* (2006.01)
(Continued)

(52) U.S. Cl.
CPC ........ *G06F 1/1632* (2013.01); *A47B 21/0314* (2013.01); *G01R 31/3644* (2013.01);
(Continued)

(58) Field of Classification Search
None
See application file for complete search history.

(56) References Cited

U.S. PATENT DOCUMENTS 5,806,943 A 9/1998 Dell et al.
6,874,431 B1 4/2005 Danna
(Continued)

OTHER PUBLICATIONS

Extended European Search report, European Patent Office, Application No. 19834495.4, Dated Mar. 1, 2022.
(Continued)

*Primary Examiner* — Anthony Q Edwards
*Assistant Examiner* — Rashen E Morrison
(74) *Attorney, Agent, or Firm* — Reichel Stohry Dean LLP; Mark C. Reichel; Natalie J. Dean (57) ABSTRACT

Disclosed are mobile battery powered workstations, methods of operating these workstations to increase warehouse and retail efficiency (through improved order fulfillment, as a mobile shipping & receiving station, mobile inventory management, and/or as mobile powered quality analysis stations), and methods of calculating remaining battery runtime for these workstations. A mobile battery powered workstation may comprise a wheeled base having a modular battery power bay, an upper workstation having a monitor, a computer, a printer, and at least one adjustable height column coupling the wheeled base to the upper workstation. The workstation may also include a glass overlay display positioned on a top surface of the upper workstation area and configured to provide order fulfillment employees with haptic feedback on remaining battery runtime, calculated via an algorithm for increased accuracy. These workstations may be used in warehouses and retail operations for order picking and fulfillment, shipping and receiving tasks, etc.

18 Claims, 8 Drawing Sheets

(51) Int. Cl.
  *G01R 31/36*      (2020.01)
  *G01R 31/367*     (2019.01)
  *G01R 31/382*     (2019.01)
  *G06K 19/077*     (2006.01)
  *G06Q 10/08*      (2023.01)

(52) U.S. Cl.
  CPC ......... *G01R 31/367* (2019.01); *G01R 31/382* (2019.01); *G06K 19/07758* (2013.01); *G06Q 10/08* (2013.01); *A47B 2200/0023* (2013.01); *A47B 2200/0075* (2013.01)

(56) References Cited

U.S. PATENT DOCUMENTS

| | | | |
|---|---|---|---|
| 7,782,607 | B2 | 8/2010 | Harbin et al. |
| 8,188,981 | B2 | 5/2012 | Shahoian et al. |
| 9,532,646 | B2 | 1/2017 | Sears |
| 9,680,333 | B1 | 6/2017 | Brooks et al. |
| 2010/0138175 | A1 | 6/2010 | Yu |
| 2010/0145160 | A1* | 6/2010 | Cinqualbre ........... A61L 2/0088 600/300 |
| 2010/0324379 | A1 | 12/2010 | Clark et al. |
| 2013/0322002 | A1 | 12/2013 | Clark et al. |
| 2015/0223892 | A1* | 8/2015 | Miller ................... A61B 50/18 345/174 |
| 2015/0245708 | A1 | 9/2015 | Abernethy et al. |
| 2017/0005512 | A1 | 1/2017 | Boyd |

OTHER PUBLICATIONS

First Examination Report, European Patent Office, Application No. 19834495.4, Dated Nov. 2, 2023.
International Searching Authority, Intrnational Search Report, PCT/US2019/041082, Dated Oct. 8, 2018.
International Searching Authortiy, Written Opinion of the International Searching Authority, PCT/US2019/041062, Dated Oct. 8, 2019.

* cited by examiner

MOBILE BATTERY POWERED WORKSTATION

PRIORITY

The present application is related to, and claims the priority benefit of, U.S. Provisional Patent Application Ser. No. 62/695,495, filed on Jul. 9, 2018, the contents of which are hereby incorporated into the present disclosure in their entirety.

BACKGROUND

With online ordering becoming more popular, efficient store and warehouse operations and processes are critical to a successful business model. Consumers place their order online and employees then need to fulfill the orders in warehouses or retail stores using mobile battery powered workstations. The warehouse or retail employees currently fill online orders by going through the warehouse or retail operation pushing a cart, which is often unpowered. The employees often need to use handheld technology devices to locate and select items, box items, print labels, and then label the items picked for shipment. Similarly, receiving and sending shipments is usually done at one fixed location, which means the employee spends a lot of time walking from shelf to station for each item.

Having a mobile battery powered workstation cart with the computer, printer, labels, supplies, and spare batteries all in one convenient mobile battery powered workstation cart would be very desirable for increasing workflow efficiency. Currently available mobile battery powered workstation carts do not have enough battery life to power all of those devices to make an efficient impact on improving warehouse and retail operations. Thus, having a workstation cart with long lasting batteries, or easily replaceable batteries, would also be desirable for increasing efficiency. These workstations can be utilized advantageously at any point in a workflow operation, including as part of quality assurance and/or analysis. It would further be desirable to have a mobile battery powered workstation cart that integrates a voice activated smart hub, an internal RFID system, GPS and/or GPS locator, WiFi, and/or Bluetooth Low Energy (BLE).

BRIEF SUMMARY

A first embodiment of a mobile battery powered workstation, comprises: a wheeled base portion having a sliding battery power bay for service and replacement of a least one battery therein; an upper workstation area having a monitor, and operably coupled to the at least one battery in the sliding battery power bay; a computer and printer operably coupled to the monitor and the at least one battery in the sliding battery power bay; and at least one adjustable height column operably coupling the wheeled base portion to the upper workstation area and configured to electronically slide vertically to adjust the height of the upper workstation area.

A method of calculating remaining battery life in a mobile battery powered workstation, comprises: determining a set power consumption rate (Pset), wherein Pset is the average power consumption of all electronic devices and accessories connected to the mobile battery powered workstation, and wherein Pset is determined during production or manufacture of the mobile battery powered workstation; and applying a custom runtime algorithm, wherein remaining battery runtime is calculated by taking remaining battery capacity (in Watt/hour) and dividing it by the set power consumption rate (Pset).

A second embodiment of a mobile battery powered workstation, comprises: a wheeled base portion having a sliding battery power bay for receiving a battery therein; an upper workstation area having electronic components operably coupled to, and powered by, the battery in the sliding battery power bay; a glass overlay display positioned over a top surface of the upper workstation area and operable to provide haptic feedback regarding remaining battery life calculated via a custom runtime algorithm; and a technology bay to house integrated RFID, Wi-Fi, BLE, and/or GPS systems.

The present disclosure includes disclosure of mobile battery powered workstations, comprising a wheeled base portion having a sliding battery power bay for service and replacement of a least one battery therein; an upper workstation area having a monitor, and operably coupled to the at least one battery in the sliding battery power bay; a computer and printer operably coupled to the monitor and the at least one battery in the sliding battery power bay; and at least one adjustable height column operably coupling the wheeled base portion to the upper workstation area and configured to electronically slide vertically to adjust the height of the upper workstation area. In at least one embodiment, the workstation further comprises a voice activated smart hub or artificial intelligence hub. In at least one embodiment, the workstation further comprises a technology bay in the upper workstation area to house the computer, an RFID reader, Wi-Fi, BLE, and/or GPS systems. In at least one embodiment, the workstation further comprises a glass overlay display positioned on a top surface of the upper workstation area, and having haptic feedback controls for passcode input, adjustment of the adjustable height column, and display of remaining battery life via custom runtime algorithm. In at least one embodiment, remaining battery runtime is calculated using an algorithm, taking remaining battery capacity (in Watt/hour) and dividing it by the set power consumption rate (Pset), wherein Pset is the average power consumption of all electronic devices and accessories connected to the mobile battery powered workstation, and wherein Pset is determined during production or manufacture of the mobile battery powered workstation. In at least one embodiment, the workstation further comprises a bracket on the adjustable height column for storing at least one spare battery. In at least one embodiment, the workstation further comprises an RFID device integrated with a glass overlay. In at least one embodiment, the workstation further comprises a handle or handle bar for easy maneuvering of the workstation, an integral pull-out tray for additional work surface area, and a lower shelf unit for additional storage. In at least one embodiment, the adjustable height column comprises UHMW low friction compressible material for smooth and stable vertical motion during adjustment to account for any gaps due to tolerance stack-up and result in a sturdy column assembly. In at least one embodiment, the workstation further comprises a service door positioned below the upper work surface area to provide easy access to power bricks and USB hub. In at least one embodiment, the workstation further comprises a slide-out keyboard tray using precision linear ball-bearing guiderails positioned on the upper workstation area. In at least one embodiment, the sliding battery power bay comprises modular compartments for receiving multiple batteries therein, wherein more than one battery may be used to adjust runtime of the workstation. In at least one embodiment, the workstation further comprises battery separating tabs disposed between battery compartments within the sliding battery power bay to reduce heat and/or improve individual battery performance. In at least one embodiment, the workstation further comprises at least one spare battery for adjusting runtime of the workstation. In at least one embodiment, the monitor itself may comprise a laptop or tablet. In at least one embodiment, the workstation is a warehouse cart. In at least one embodiment, the workstation is an order fulfillment cart. In at least one embodiment, the glass overlay display has anti-bacterial and chemical resistant properties.

The present disclosure includes disclosure of methods of calculating remaining battery runtime in a mobile battery powered workstation, comprising determining a set power consumption rate (Pset), wherein Pset is the average power consumption of all electronic devices and accessories connected to the battery powered mobile workstation, and wherein Pset is determined during production or manufacture of the battery powered mobile workstation; and applying a custom runtime algorithm, wherein remaining battery runtime is calculated by taking remaining battery capacity (in Watt/hour) and dividing it by the set power consumption rate (Pset). In at least one embodiment, the method further comprises displaying the remaining battery runtime on an illuminated glass overlay positioned on a top surface of the upper workstation area of the mobile battery powered workstation. In at least one embodiment, the remaining battery runtime is communicated to a user via haptic feedback.

The present disclosure includes disclosure of mobile battery powered workstations, comprising a wheeled base portion having a battery power bay for receiving a battery therein; an upper workstation area having electronic components operably coupled to, and powered by, the battery in the battery power bay; a glass overlay display positioned over a top surface of the upper workstation area and operable to provide haptic feedback regarding remaining battery life calculated via a custom runtime algorithm; and a technology bay to house integrated RFID, Wi-Fi, BLE, and/or GPS systems. In at least one embodiment, the electronic components further comprise a computer, laptop, tablet, printer, barcode reader/scanner, or monitor. In at least one embodiment, the workstation further comprises a voice activated smart hub or artificial intelligence hub. In at least one embodiment, the workstation further comprises at least one adjustable height column operably coupling the wheeled base portion to the upper workstation area and configured to electronically slide vertically to adjust the height of the upper workstation area. In at least one embodiment, the at least one adjustable height column comprises UHMW low friction compressible material for smooth and stable vertical motion during adjustment to account for any gaps due to tolerance stack-up and result in a sturdy column assembly. In at least one embodiment, the workstation further comprises at least one spare battery. In at least one embodiment, the workstation further comprises a handle or handle bar for easy maneuvering of the workstation, an integral pull-out tray for additional work surface area, and a lower shelf unit for additional storage. In at least one embodiment, the workstation further comprises a service door positioned below the upper work surface area to provide easy access to power bricks and USB hub. In at least one embodiment, the battery power bay comprises modular compartments for receiving multiple batteries therein, wherein more than one battery may be used to adjust runtime of the workstation. In at least one embodiment, the workstation further comprises battery separating tabs disposed between the battery compartments of the battery power bay to reduce heat and/or improve individual battery performance. In at least one embodiment, the workstation is a warehouse cart. In at least one embodiment, the workstation is an order fulfillment cart. In at least one embodiment, the glass overlay display has anti-bacterial and chemical resistant properties. In at least one embodiment, the battery power bay is operated by sliding. In at least one embodiment, remaining battery runtime is calculated using an algorithm, taking remaining battery capacity (in Watt/hour) and dividing it by the set power consumption rate (Pset), wherein Pset is the average power consumption of all electronic devices and accessories connected to the mobile battery powered workstation, and wherein Pset is determined during production or manufacture of the mobile battery powered workstation.

BRIEF DESCRIPTION OF THE DRAWINGS

The disclosed embodiments and other features, advantages, and disclosures contained herein, and the matter of attaining them, will become apparent and the present disclosure will be better understood by reference to the following description of various exemplary embodiments of the present disclosure taken in conjunction with the accompanying drawings, wherein.

As such, an overview of the features, functions and/or configurations of the components depicted in the various figures will now be presented. It should be appreciated that not all of the features of the components of the figures are necessarily described and some of these non-discussed features (as well as discussed features) are inherent from the figures themselves. Other non-discussed features may be inherent in component geometry and/or configuration. Furthermore, wherever feasible and convenient, like reference numerals are used in the figures and the description to refer to the same or like parts or steps. The figures are in a simplified form and not to precise scale.

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

The present disclosure includes various battery powered mobile workstation (or carts) 100, systems, and methods for operation of a battery powered mobile workstation 100. An exemplary lithium battery (or other battery) powered mobile workstation 100 of the present disclosure may include a computer 114, printer 116, barcode reader/scanner 118, a mouse 120, artificial intelligence hub 130, and/or other electronic devices necessary for completion of order picking or order fulfillment tasks by employees. These battery powered mobile workstations 100 can be utilized to improve order fulfillment efficiency in warehouses or other retail operations, as well as in various other operations and industries. These battery powered mobile workstations 100 may be used for a variety of tasks, including, but not limited to, order picking, order fulfillment, shipping, receiving, etc. These mobile battery powered workstations 100 may efficiently aid employees in larger fulfillment warehouses or in larger retail operations. These battery powered workstations 100 are powered by a rechargeable battery in the lower base portion 104 to support the mobile computer 114, barcode-reading 118, artificial intelligence hub 130, and printing devices 116 needed to support order fulfillment.

Figure 1:
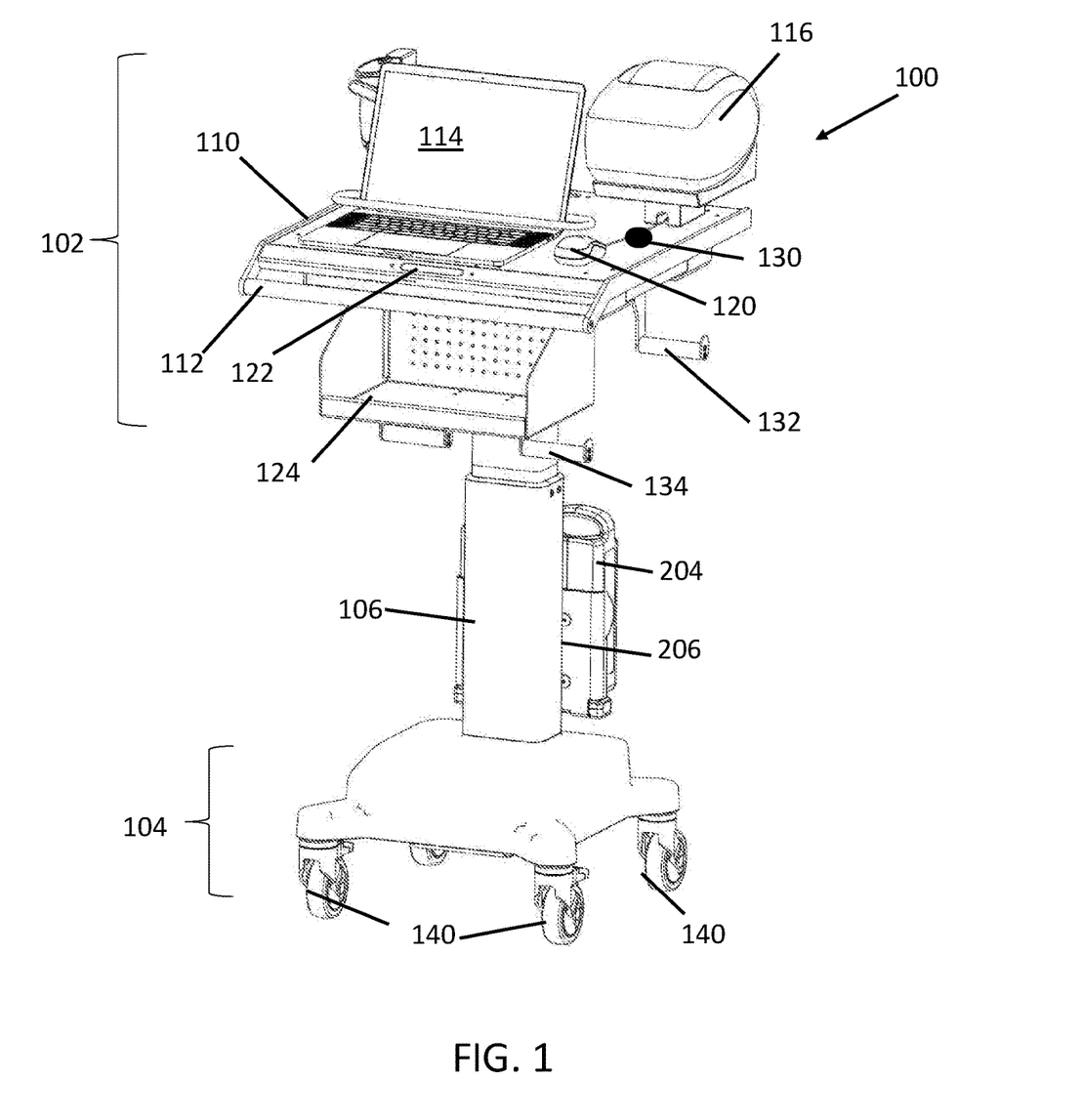
FIG. 1 illustrates a perspective view of a first embodiment of a mobile battery powered workstation having an upper workstation area and a lower wheeled base area.
Figure 2:
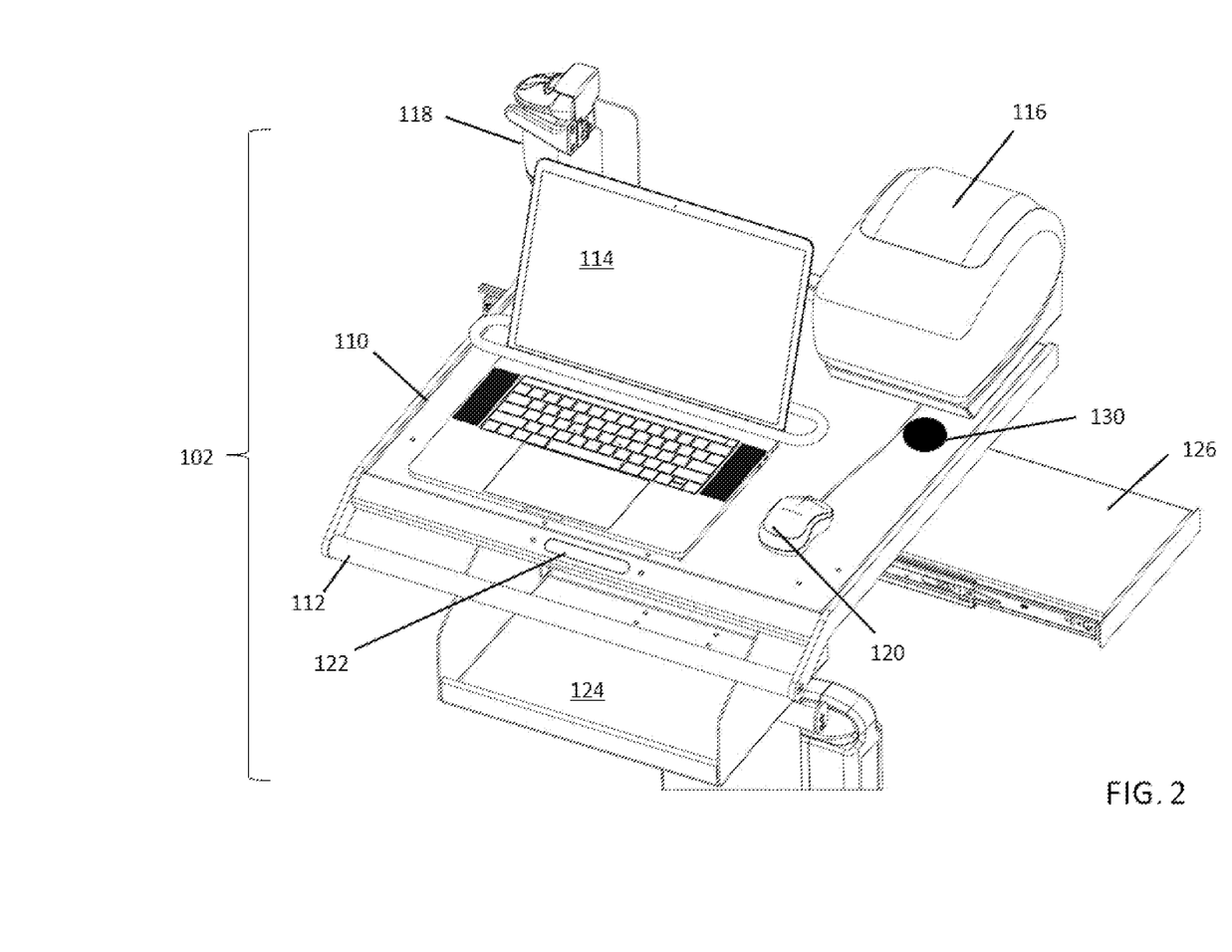
FIG. 2 illustrates an exemplary upper workstation area of a battery powered mobile workstation of the present invention.
Figure 3:
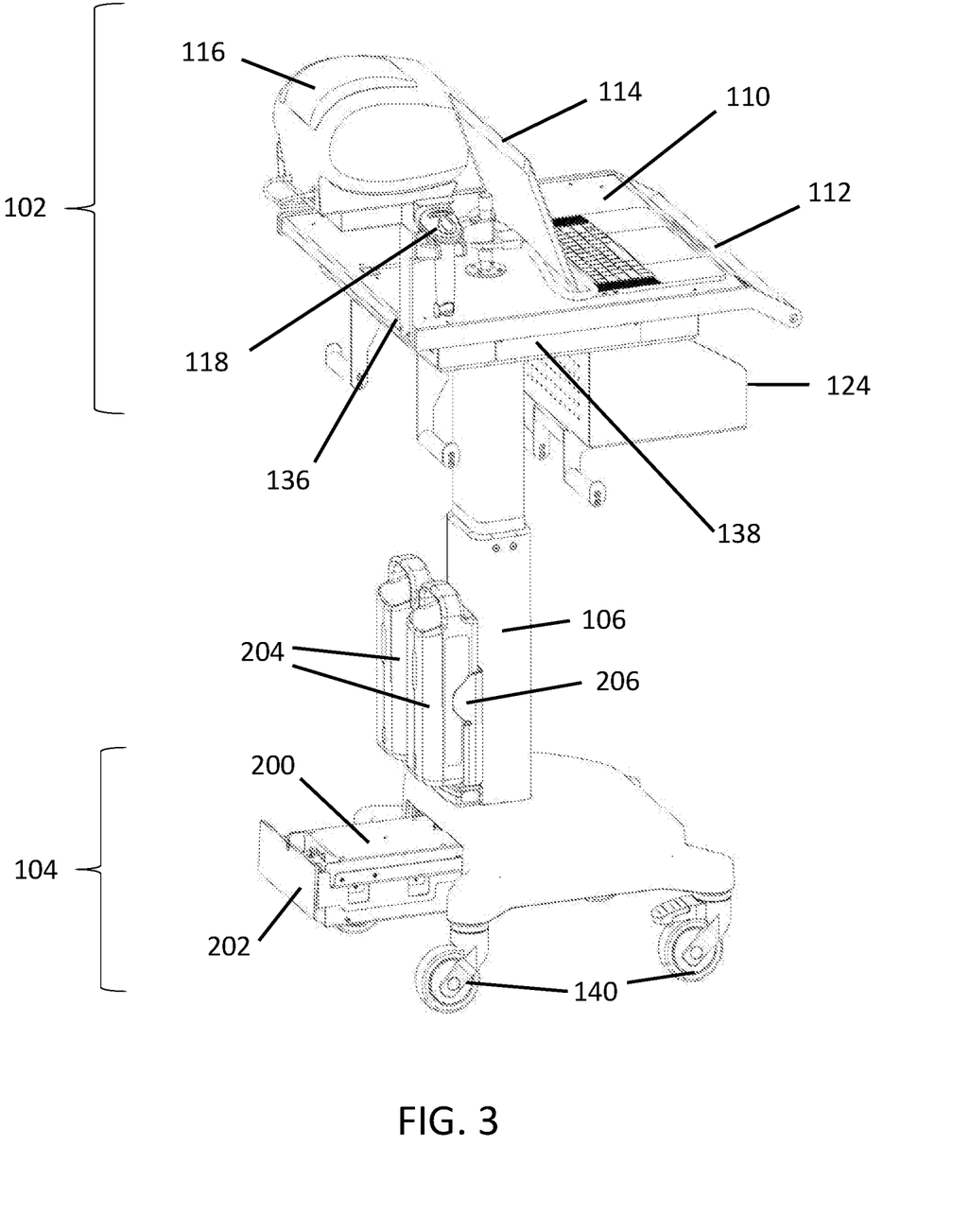
FIG. 3 illustrates a perspective view of a first embodiment of a mobile battery powered workstation having an upper workstation area and a lower wheeled base area and showing the sliding battery power bay to access to the battery or power storage system.

A first embodiment of a mobile battery powered workstation 100 having an upper workstation area 102 and a lower wheeled base area 104, is shown and described in FIGS. 1 and 3. FIG. 2 illustrates an exemplary upper workstation area 102 of a battery powered mobile workstation 100 of the present disclosure.

As shown in FIG. 1, the mobile battery powered workstation 100 may comprise a standing desk height tower/cart having an upper workspace area 102 connected to a lower wheeled base area 104. The upper workspace area 102 and lower wheeled base area 104 can be connected by an elongated adjustable height column 106, such as shown in FIG. 1. The adjustable height column 106 is configured to be vertically adjustable, such as by sliding, to change the height of the upper workspace area 102 to comfortably accommodate workers having different heights. The upper workstation area 102 may generally comprise several electronic components, while the lower wheeled base area 104 may generally comprise the battery power bay 202 (described in further detail herein) and wheels 140 to roll or move the entire battery powered mobile workstation 100 anywhere necessary for performing employee tasks.

Figure 8:
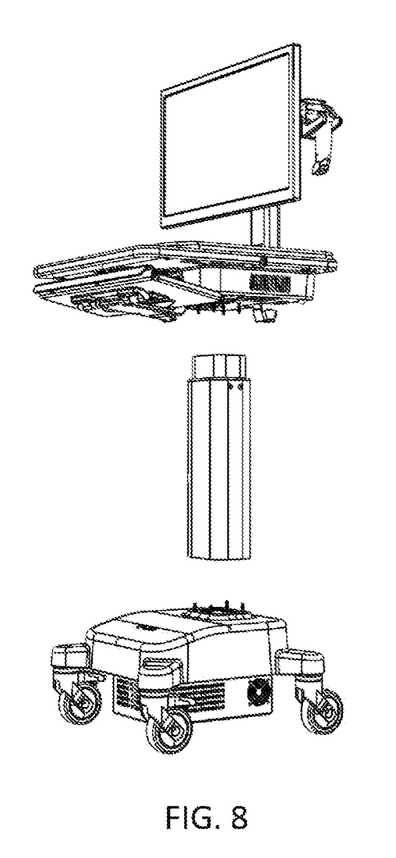
FIG. 8 illustrates a perspective view of the simple assembly of an exemplary mobile battery powered workstation cart.
Figure 9:
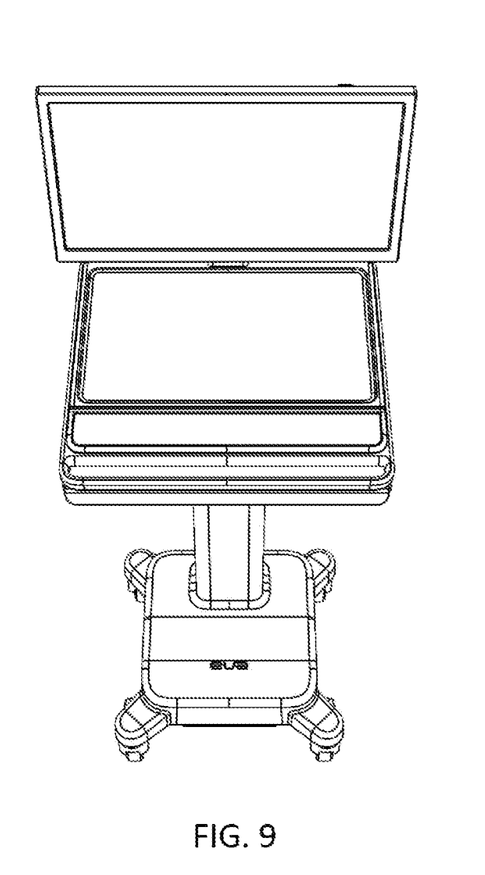
FIG. 9 illustrates a top view of an exemplary mobile battery powered workstation cart formed of highgrade aluminum.

As shown in FIG. 1, battery powered mobile workstation 100 may generally comprise four wheels 140 attached to lower base area 104, which may be formed of a metal and/or rigid plastic frame. The frame may be a highgrade aluminum frame to provide strength and durability, while remaining very lightweight and easy to maneuver (FIG. 9 shows an aluminum frame). The workstation 100 may be assembled simply (such as using only 8 total screws, for example, as shown in FIG. 8) to provide easy assembly and maintenance (reducing downtime) and may further use stainless steel fasteners to provide corrosion resistance. While four wheels 140 are shown for purposes of illustration, it should be understood that more than four wheels, or fewer than four wheels, may be used herein. The wheels may be 100 mm precision ball bearing caster wheels with locks, for example, giving the workstation 100 the ability to move smoothly and with minimal effort. The lower base area 104 may further comprise a sliding battery power bay 202, shown in FIG. 3 and described in more detail herein below, for receiving a battery 200 therein. The lower wheeled base area 104 is coupled to upper workstation area 102 by an adjustable height column 106, which may also be formed of a metal or rigid plastic frame. In some embodiments, the lower base area 104 may be formed of an aluminum die-cast base, for example.

The adjustable height column 106, shown in FIG. 1, may be partially hollow to provide a conduit to electrically couple the electronic components on the upper workstation area 102 with the battery in the lower wheeled base area 104. The adjustable height column 106 is configured to electronically move vertically up and down, such as by sliding, so that the overall height of the upper workstation area 102 can be changed to comfortably accommodate workers of different heights. In some embodiments, the adjustable height column may comprise interior ultra high molecular weight (UHMW) low friction tape to provide smooth and stable vertical motion.

As shown in FIGS. 1 and 2, the upper workstation area 102 may generally comprise a worksurface area 110 having several electronic components thereon and a handle or handle bar 112, all of which are adjustable in height due to the adjustable height column 106. A user can roll and guide the movement of the mobile workstation 100 using the handle bar 112. The handle bar 112 may run the length or width of the perimeter of the worksurface area 110, so that a user can easily grasp the handle bar 112 to roll and guide the movement of the workstation 100. In some warehouse operations, the mobile workstation 100 may need to be moved frequently and/or long distances thus, handle or handle bar 112 may be a comfortable 1" diameter grip handle and/or handle-bar, for example.

The top worksurface area 110, shown in FIG. 2, may include an area for a laptop computer or tablet 114 (or monitor), a printer 116, a barcode reader/scanner 118, a mouse 120, and space for a voice-activated smart hub or artificial intelligence hub 130. The voice-activated smart hub 130 may be an integral part of computer 114 (such as software or another program), or may be a separate component 130, such as an Amazon Echo Dot® or Google Home®, or other similar voice-activated platform using artificial or machine intelligence (i.e., machine mimicking human cognitive function), mounted to or resting on worksurface area 110 and may interact with the warehouse's software database(s) and/or WiFi to send and receive warehouse and/or retail order fulfillment information. The voice-activated smart hub 130 may help order fulfillment employees answer questions on stocking or cart status, for example. Equipping a mobile battery powered workstation 100 with an artificial intelligence hub 130 will allow the workstation cart to have an artificial intelligence powered hub 130 at the point of fulfillment to assist the employees in performing their jobs faster and more efficiently and will establish the foundation for future artificial intelligence software within order fulfillment operations. The artificial intelligence hub 130 can interact with the warehouse's software/database(s) so that the employees can use a hands-free device to send and receive information, such as order fulfillment information.

Computer 114 represents various types of computing devices (e.g. laptop PCs, desktop or tower PCs, tablets, and phones), while printer 116 represents multiple standard printers and/or label printers, and each can include components and accessories to power the same. Printer 116 and printer holder 116 (implying an apparatus for retaining a printer) are used interchangeably herein. A large printer shelf 128 may be located below printer 116, as shown in FIG. 1.

Computer 114, as referenced herein, is a general term for a computing device, which may include, but is not limited to, a laptop computer, a tablet, and the like. In some embodiments, a laptop lock may be used to lock or secure computer 114 (or laptop) to the top worksurface area 110 to prevent accidental damage. The mouse 120 may be a computer mouse apparatus separate from computer 114 or may be an integral part of computer 114, such as a touchpad, and is shown in FIGS. 1 and 2 only for exemplary purposes. Barcode reader/scanner 118 (best shown in FIG. 3) and barcode reader/scanner holder 118 (implying an apparatus for retaining a barcode reader/scanner) are used interchangeably herein. Barcode reader/scanner 118 can refer to a holder and/or scanner with or without a holder, can support standard barcode scanner models, and can include components and accessories to charge the same. Computer 114, printer 116, barcode reader/scanner 118, mouse 120, and artificial intelligence hub 130 are shown herein for purposes of illustration, but some embodiments may comprise additional, or fewer, electronic components as being within the scope of the present invention.

The top worksurface area 110, shown in FIG. 2, may also include a glass overlay display 122. The glass overlay display 122 may generally comprise push or touch button password controls for haptic feedback and/or an illuminated display showing relevant mobile workstation 100 information. For example, the haptic feedback of the glass overlay display may vibrate, or otherwise signal a user, when the cart 100 needs a battery replacement. Additionally, the glass overlay display 122 may also have anti-bacterial or chemical-resistant properties. In some embodiments, the glass overlay display 122 may also be made out of plastic, or some other transparent material other than glass.

In one embodiment, the glass overlay display 122 may display remaining battery life and/or battery charging status, whether or not the cart 100 is plugged in, whether or not the cart 100 is in use, etc. The remaining battery life may be more precisely calculated by determining a set power consumption rate and then applying a custom runtime algorithm for increased accuracy. The custom runtime algorithm may take the remaining battery capacity and divide it by a set power consumption (set by the installer or integrator on the utility software) to obtain a more accurate battery runtime reading.

The glass overlay display 122 may further include controls for automatic height adjustment of the adjustable height column 106. These haptic feedback control features of the glass overlay display 122 are advantageous for providing order fulfillment employees with additional relevant information about the mobile workstation 100 to increase overall employee efficiency in order fulfillment operations.

As shown in FIG. 3, the top worksurface area 110, may also include a technology bay 136 housing internal radio frequency identification (RFID), global positioning system (GPS) and/or GPS locator, WiFi, and/or Bluetooth Low Energy (BLE) (or Wi-Fi Triangulation, or program similar to iBeacon) systems therein. The RFID may be used for employee identification purposes. The Wi-Fi capability will allow the battery powered workstation 100 to connect to the warehouse's WiFi network. The BLE capability can communicate the cart's location within a large warehouse or retail operation, while the GPS can transmit the workstation's location outside of the warehouse or retail operation. In very large warehouse or retail order fulfillment operations, the BLE and GPS can be used simultaneously to monitor the location of many mobile workstations 100, such as to determine the number of workstations in use in on each floor, wing, or section of a warehouse or retail order fulfillment operation. The Wi-Fi capability will be important for integrating the battery powered workstation 100 with the existing technology and software. For example, the Wi-Fi may be used to provide the orders to the employee fulfilling the order. The Wi-Fi may also help to monitor order fulfillment progress and may also be used to map the fastest route for completing the order fulfillment tasks. With continuing reference to FIG. 3, the top worksurface area 110 may also include a service door 138. The service door 138 may be located below the top worksurface area 110 and may provide easy access to power bricks and USB hub.

These battery powered mobile workstations 100 may be used in combination with a tracking and monitoring system to track and monitor an entire fleet of other similar (or identical) carts 100. The mobile workstation carts 100 using the tracking and monitoring system can all communicate via BLE and/or GPS, such as by using small tracking beacons positioned on the carts themselves 100, as well as all around the warehouse or other facility. This tracking system may also use its own secure network and provide efficiency monitoring and fleet management. For example, if a cart 100 is constantly being plugged in when the battery charge is at 80%, then the cart 100 is not being used efficiently and the tracking and monitoring system can send the administrator a notice to alert them that they could be using the battery life/runtime more efficiently. The tracking and monitoring system can also alert the administrator about the health of the fleet of carts 100, errors detected, and can pinpoint problems or areas needing improvement.

Positioning the upper workstation area 102 at a comfortable and ergonomic height for each employee (via adjustable height column 106), provides easy viewing of the screen of computer 114, as well as easy access to the printer 116, computer mouse 120, barcode reader/scanner 118, and artificial intelligence hub 130 for a user/employee using the mobile battery powered workstation cart 100 in a warehouse. In this embodiment, a user/employee can easily view the computer screen 114 while pushing the battery powered mobile workstation 100 through the warehouse (or other retail operation) to complete order fulfillment. Portable barcode scanners, portable printers, and/or PDAs can also have a docking station on the cart 100 so that the user can dock items to free up their hands while fulfilling orders.

Additionally, the upper workstation area 102 may also contain a storage shelf area 124, such as a drawer, cabinet, shelf or bin with non-skid pads, as shown in FIGS. 1 and 2. This shelf 124 may be convenient for storing extra labels, envelopes, packing materials, forms, stickers, label rolls, and any other items necessary for order fulfillment. In one example, the shelf 124 may be located underneath the handle bar 112, so that it is easily accessed by the user/employee. However, it should be understood the shelf 124 may be located in other positions on the mobile battery powered workstation 100. Additionally, the upper workstation area 102 may include a large label holder 132 and/or a small label holder 134 to provide easy access to labels of various sizes. Having all of the necessary supply items in one place, on the upper worksurface area 102 of a mobile workstation 100, will greatly increase employee efficiency in order fulfillment operations.

Additionally, as shown in FIG. 2, the upper workstation area 102 may comprise a retractable tray 126 to provide additional worksurface area for a user. In this embodiment, a user may pull out a sliding tray, or flip up a handing tray, to access additional work surface area. A user may pull or slide the tray out to provide a flat writing or working surface and then the user can push the tray back in when the task is complete. The retractable tray 126, or pull out tray 126, may operate via ball bearing drawer slides having a removable tab, for example. The retractable tray 126 may be positioned at a convenient height for writing or typing while standing, such as near handle bar 112, or just below top worksurface area 110.

The battery powered workstation 100 may operate as a mobile base workstation, for holding and powering the electronic components (such as a computer 114, printer 116, barcode reader/scanner 118, mouse 120, and artificial intelligence hub 130) using a battery or batteries 200 located in the lower base area 104. As shown in FIG. 3, the battery powered workstation 100 may comprise a battery or multiple batteries 200 (which may also be referred to as a power system, such as being AC powered with a cable). Battery or batteries 200 may comprise a lithium battery, for example, which is rechargeable (so to cover a desired amount of time, such as at least one or two work shifts, for example) and/or swappable, and/or removable. While the embodiments described herein utilize a lithium battery, other batteries may also be used herein within the scope of the present disclosure. Additionally, in some embodiments, a DC battery setup may be utilized to extend battery runtime to greater than 40 hours.

In this embodiment, shown in FIG. 3, the battery or batteries 200 are housed in a sliding power bay 202 located in the lower base area 104 of the workstation 100. Battery or batteries 200 may be housed within a sliding battery power bay 202 to provide easy access to a user needing to perform maintenance or change the battery 200. The sliding power bay 202 may easily roll or operate via ball bearing drawer slides, for example. The lithium battery or batteries 200 may be operably coupled to the electronic components (such as computer 114, printer 116, barcode reader/scanner 118, mouse 120, and an artificial intelligence hub 130) to provide power. Additionally, the lithium battery or batteries 200 may be large enough to provide battery power for at least one employee shift, or approximately 8 hours. However, in other embodiments, the lithium battery or batteries 200 will be large enough to provide power for multiple employee shifts. The lithium battery or batteries 200 can be recharged, such as by plugging it in to a wall outlet and/or by replacing a battery 200 with another fully charged battery 200. Extra batteries 204, may be stored in a dual battery holder bracket 206 located on adjustable height column 106. As best shown in FIG. 3, the dual battery holder bracket 206 may hold two extra batteries 204, however, any number of extra batteries may be stored on the cart 100 to provide for faster and more efficient battery replacement by workers using the mobile workstation 100.

Figure 4:
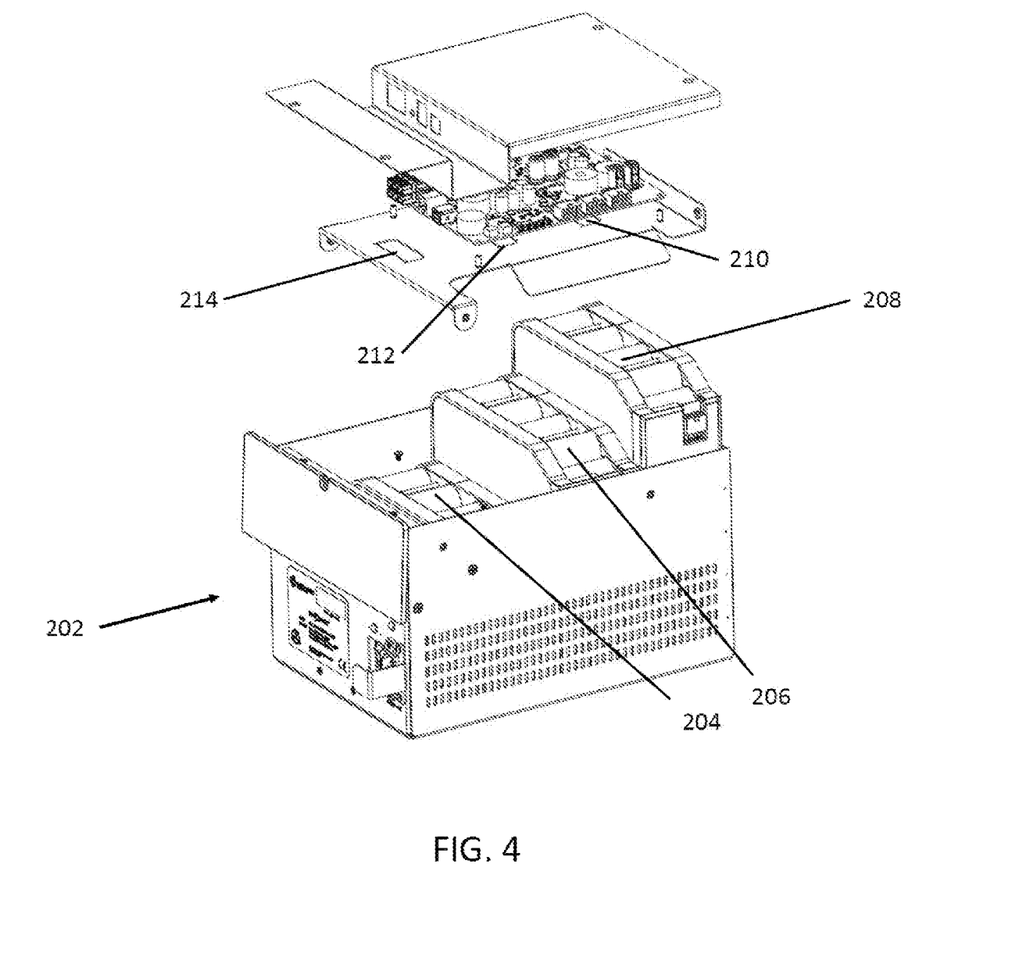
FIG. 4 illustrates an exemplary embodiment of a sliding battery power bay having modular battery compartments.

As shown in FIG. 4, the sliding battery power bay 202 may be modular or reconfigurable to accommodate different numbers of batteries therein. FIG. 4 illustrates an exemplary configuration of a sliding battery power bay 202 having three batteries, 204, 206, and 208 therein. Each battery 204, 206, 208 may have its own compartment or pocket within the sliding battery power bay 202. The batteries 204, 206, 208 and/or battery compartments may be separated by battery separating tabs 210, 212, 214, to help reduce heat and improve performance of the individual batteries. In this embodiment, the sliding battery power bay 202 is configurated to hold three batteries 204, 206, and 208, thus giving the workstation triple the runtime of a workstation/cart with only one battery.

This reconfigurable or modular design of the sliding battery power bay 202 allows the runtime of the workstation to be adjusted by providing a different number of batteries in the sliding battery power bay 202, thus allowing the runtime and overall cost of the workstation to be adjusted to meet consumer needs and budgets. For example, a sliding battery power bay 202 having a single battery 200 will have a shorter runtime and a lower cost. However, a sliding battery power bay 202 having multiple batteries (such as 204, 206, 208) will have a longer runtime and a higher cost. The size of the compartments and/or the sliding battery power bay 202 can be changed as desired to correspond to the desired number of batteries or runtime or number of hours in an employee shift. For example, the workstation having a single battery 200 may be a 'single shift' workstation, while the workstation having multiple batteries 200 may be a 'multiple shift' workstation. In one example, a single battery may have a runtime of approximately 13 hours, a dual battery may have a runtime of approximately 26 hours, and a triple battery may have a runtime of approximately 40 hours. However, the sliding battery power bay 202 may be configured to accommodate any number of batteries and/or compartments therein, having various runtimes, as will be understood by those of ordinary skill in the art.

Storing additional batteries on the mobile workstation 100 or 200 itself allows employees to easily and quickly swap or replace batteries during a work shift to maximize efficiency. Employees can simply pull open the sliding battery power bay 202, remove an extra battery 204 from the battery holder bracket 206, swap the old dead battery 200 for the new extra (fully charged) battery 204, place the old dead battery 200 in the battery holder bracket 206 (for later recharging or replacement), push the sliding battery power bay 202 closed, and resume work operations.

Figure 5:
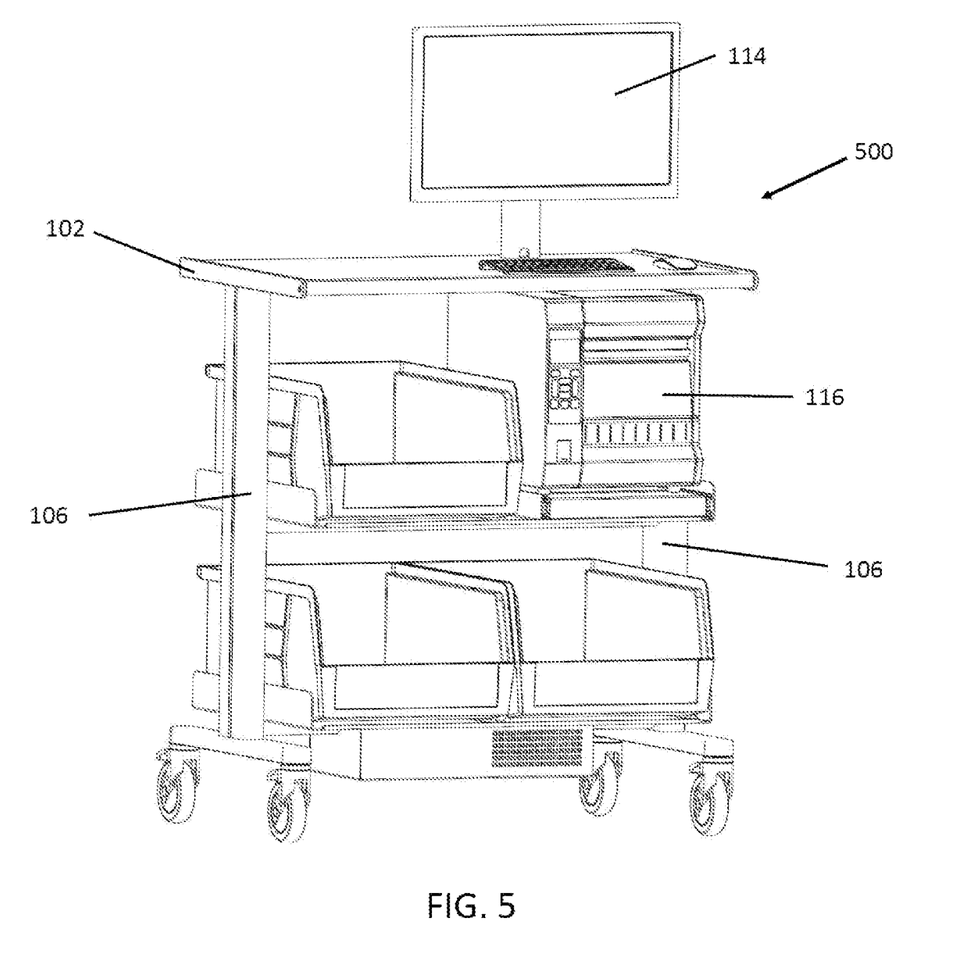
FIG. 5 illustrates a perspective view of an embodiment of a mobile battery powered workstation having a large upper workstation area as well as a computer, monitor, printer etc.

FIG. 5 illustrates a perspective view of an embodiment of a mobile battery powered workstation 500 having a larger upper workstation area 102 with a monitor 114, as well as a full computer and printer 116, etc. positioned below the upper workstation area 102. In this embodiment, it should be noted that monitor 114 may be replaced with a laptop or tablet computer. Further, the cart 500 may comprise two (i.e., dual) adjustable height columns 106 for additional support. This embodiment provides additional storage space (shown as bins in FIG. 5) between the two adjustable height columns 106 for conveniently storing more order fulfillment supplies (i.e., labels, stickers, envelopes, boxes, tape, and other related packing and shipping materials), while still providing mobility and the full computing abilities necessary for employees to efficiently perform order fulfillment tasks.

Figure 6A:
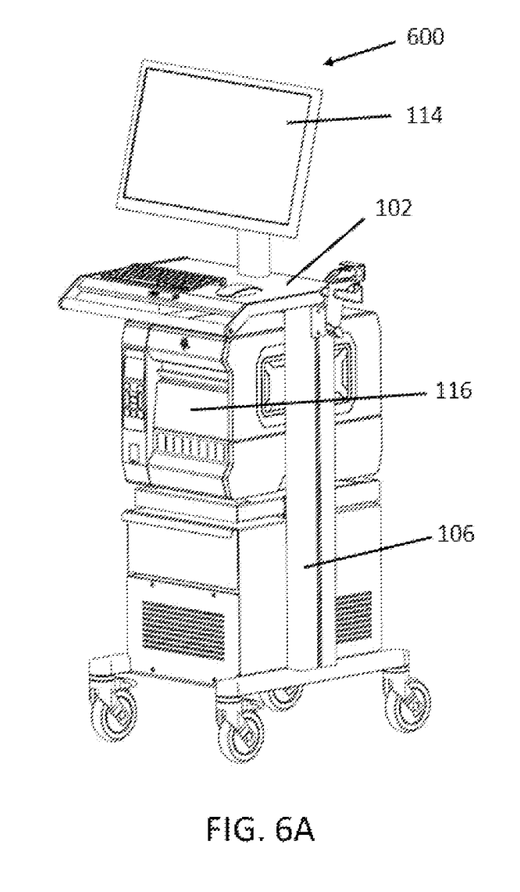
FIGS. 6A and 6B illustrates a perspective view of another embodiment of a mobile battery powered workstation having a computer, monitor, printer, etc.
Figure 6B:
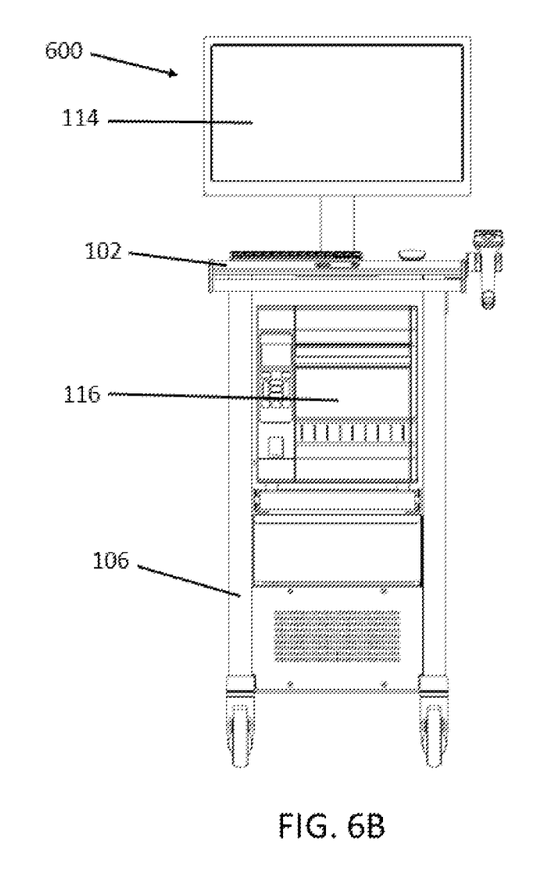

FIGS. 6A and 6B illustrate a perspective view of another embodiment of a mobile battery powered workstation 600 having a smaller upper workstation area 102 and monitor 114, while still providing the full computer and printer 116, etc. necessary for employees to efficiently perform order fulfillment tasks. In this embodiment, the cart 600 may also comprise two (i.e., dual) adjustable height columns 106 for additional support. This workstation/cart 600 may have a smaller profile than the workstation/cart 500 shown in FIG. 5, for increased maneuverability within an order fulfillment setting, while still providing the full computing capabilities for efficient order fulfillment operations, thus permitting more workstation/carts 600 (i.e., more employees) to be positioned and working within a small space.

Figure 7A:
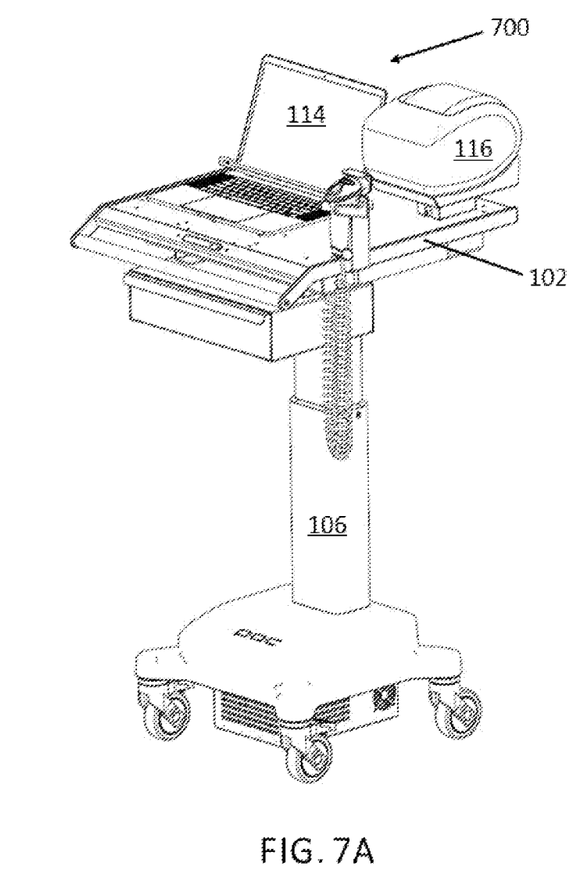
FIGS. 7A and 7B illustrates a perspective view of yet another embodiment of a mobile battery powered workstation having a laptop computer, etc.
Figure 7B:
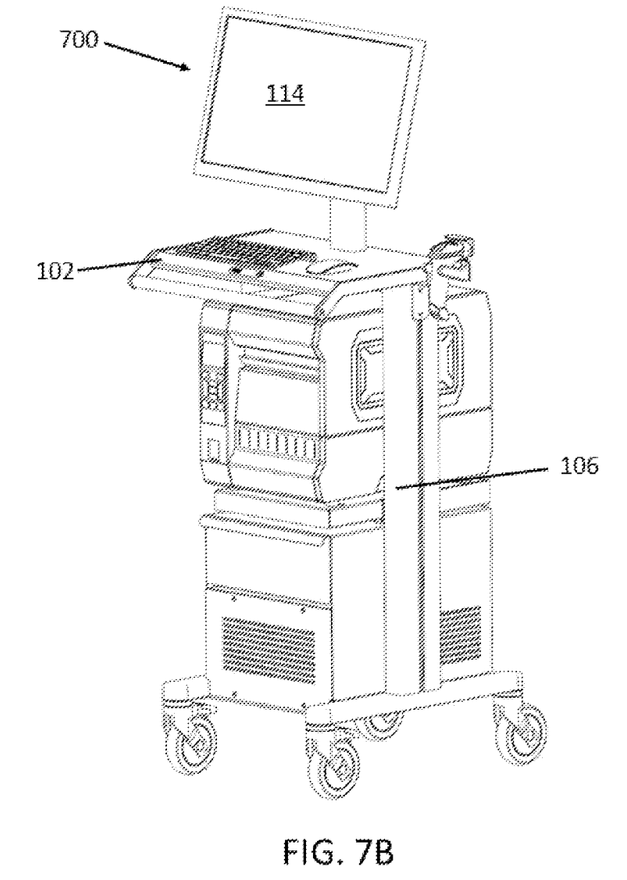

FIGS. 7A and 7B illustrate a perspective view of yet another embodiment of a mobile battery powered workstation 700 having a laptop computer 114 positioned on the upper workstation area 102. This embodiment provides the flexibility of a removable laptop computer 114 for order fulfillment employees, while still providing a smaller profile workstation/cart 700 having some storage and printing capabilities necessary for order fulfillment operations within smaller spaces.

While various embodiments of devices and systems and methods for using the same have been described in considerable detail herein, the embodiments are merely offered as non-limiting examples of the disclosure described herein. It will therefore be understood that various changes and modifications may be made, and equivalents may be substituted for elements thereof, without departing from the scope of the present disclosure. The present disclosure is not intended to be exhaustive or limiting with respect to the content thereof.

Further, in describing representative embodiments, the present disclosure may have presented a method and/or a process as a particular sequence of steps. However, to the extent that the method or process does not rely on the particular order of steps set forth therein, the method or process should not be limited to the particular sequence of steps described, as other sequences of steps may be possible. Therefore, the particular order of the steps disclosed herein should not be construed as limitations of the present disclosure. In addition, disclosure directed to a method and/or process should not be limited to the performance of their steps in the order written. Such sequences may be varied and still remain within the scope of the present disclosure.

The invention claimed is:

1. A mobile battery powered workstation, comprising:
   a wheeled base portion having a sliding battery power bay for service and replacement of a least one battery therein;
   an upper workstation area having a monitor, and operably coupled to the at least one battery in the sliding battery power bay;
   a computer and printer operably coupled to the monitor and the at least one battery in the sliding battery power bay;
   at least one adjustable height column operably coupling the wheeled base portion to the upper workstation area and configured to electronically slide vertically to adjust the height of the upper workstation area; and
   a glass overlay display positioned on a top surface of the upper workstation area, and having haptic feedback controls for passcode input, adjustment of the adjustable height column, and display of remaining battery life via custom runtime algorithm.

2. The mobile battery powered workstation of claim 1, further comprising a voice activated smart hub or artificial intelligence hub.

3. The mobile battery powered workstation of claim 1, further comprising a technology bay in the upper workstation area to house the computer, an RFID reader, Wi-Fi, BLE, and/or GPS systems.

4. The mobile battery powered workstation of claim 1, wherein remaining battery runtime is calculated using an algorithm, taking remaining battery capacity (in Watt/hour) and dividing it by the set power consumption rate (Pset), wherein Pset is the average power consumption of all electronic devices and accessories connected to the mobile battery powered workstation, and wherein Pset is determined during production or manufacture of the mobile battery powered workstation.

5. The mobile battery powered workstation of claim 1, further comprising an RFID device integrated with a glass overlay.

6. The mobile battery powered workstation of claim 1, wherein the adjustable height column comprises UHMW low friction compressible material for smooth and stable vertical motion during adjustment to account for any gaps due to tolerance stack-up and result in a sturdy column assembly.

7. The mobile battery powered workstation of claim 1, wherein the sliding battery power bay comprises modular compartments for receiving multiple batteries therein, wherein more than one battery may be used to adjust runtime of the workstation.

8. The mobile battery powered workstation of claim 1, further comprising battery separating tabs disposed between battery compartments within the sliding battery power bay to reduce heat and/or improve individual battery performance.

9. The mobile battery powered workstation of claim 1, further comprising at least one spare battery for adjusting runtime of the workstation.

10. The mobile battery powered workstation of claim 1, wherein the monitor itself may comprise a laptop or tablet.

11. The mobile battery powered workstation of claim 1, wherein the workstation is a warehouse cart.

12. The mobile battery powered workstation of claim 1, wherein the workstation is an order fulfillment cart.

13. The mobile battery powered workstation of claim 1, wherein the glass overlay display has anti-bacterial and chemical resistant properties.

14. A method of calculating remaining battery runtime in a mobile battery powered workstation, comprising:
   determining a set power consumption rate (Pset), wherein Pset is the average power consumption of all electronic devices and accessories connected to the battery powered mobile workstation, and wherein Pset is determined during production or manufacture of the battery powered mobile workstation;
   applying a custom runtime algorithm, wherein remaining battery runtime is calculated by taking remaining battery capacity (in Watt/hour) and dividing it by the set power consumption rate (Pset); and
   displaying the remaining battery runtime on an illuminated glass overlay positioned on a top surface of the upper workstation area of the mobile battery powered workstation, the glass overlay further having haptic feedback controls for passcode input, adjustment of the adjustable height column, and display of remaining battery life via custom runtime algorithm.

15. The method of claim 14, wherein the remaining battery runtime is communicated to a user via haptic feedback.

16. A mobile battery powered workstation, comprising:
   a wheeled base portion having a battery power bay for receiving a battery therein;
   an upper workstation area having electronic components operably coupled to, and powered by, the battery in the battery power bay;
   a glass overlay display positioned over a top surface of the upper workstation area and operable to provide haptic feedback regarding remaining battery life calculated via a custom runtime algorithm;
   the glass overlay display having haptic feedback controls for passcode input, adjustment of the adjustable height column, and display of remaining battery life via custom runtime algorithm; and
   a technology bay to house integrated RFID, Wi-Fi, BLE, and/or GPS systems.

17. The mobile battery powered workstation of claim 16, wherein the battery power bay comprises modular compartments for receiving multiple batteries therein, wherein more than one battery may be used to adjust runtime of the workstation.

18. The mobile battery powered workstation of claim 16, further comprising battery separating tabs disposed between the battery compartments of the battery power bay to reduce heat and/or improve individual battery performance.

\* \* \* \* \*